United States Patent [19]
Jarvis

[11] Patent Number: 5,383,512
[45] Date of Patent: Jan. 24, 1995

[54] METHOD FOR FABRICATING A SUBSTRATE HAVING SPACED APART MICROCAPILLARIES THEREON

[75] Inventor: Eric E. Jarvis, Boulder, Colo.

[73] Assignee: Midwest Research Institute, Kansas City, Mo.

[21] Appl. No.: 65,777

[22] Filed: May 24, 1993

Related U.S. Application Data

[63] Continuation-in-part of Ser. No. 9,853, Jan. 27, 1993, abandoned.

[51] Int. Cl.$^6$ .......................................... B22D 23/00
[52] U.S. Cl. .................... 164/46; 204/192.1; 264/81
[58] Field of Search ............ 264/81, 105, 309, 316, 264/317; 249/117, 140; 204/192.1, 192.12, 192.14; 164/46

[56] References Cited

U.S. PATENT DOCUMENTS

| | | | |
|---|---|---|---|
| 2,629,907 | 3/1953 | Hugger | 22/200 |
| 3,961,099 | 6/1976 | Gipstein et al. | 427/43 |
| 3,996,991 | 12/1976 | Ugata et al. | 164/35 |
| 4,481,999 | 11/1984 | Duchane | 164/6 |
| 4,818,255 | 4/1989 | Matsuura et al. | 55/16 |
| 4,867,223 | 9/1989 | Matsumura | 164/46 |
| 4,898,623 | 2/1990 | Pinkhasov | 148/3 |
| 4,926,056 | 5/1990 | Spindt | 250/423 F |
| 4,968,397 | 11/1990 | Asher et al. | 204/141.5 |
| 5,066,312 | 11/1991 | Ishak et al. | 51/295 |
| 5,120,807 | 6/1992 | Wei et al. | 526/204 |
| 5,185,613 | 2/1993 | Whatmore et al. | 343/909 |
| 5,256,297 | 10/1993 | Feimer et al. | 210/651 |
| 5,280,384 | 1/1994 | Shibasaki | 359/396 |

OTHER PUBLICATIONS

Martin et al., Template synthesis of organic microtubules, J. Am. Chem. Soc. 112:8976–8977 (1990).
Brumlik et al., Template Synthesis of metal microtubules, J. Am. Chem. Soc. 113:3174–3175 (1991).

*Primary Examiner*—Christopher A. Fiorilla
*Attorney, Agent, or Firm*—Ken Richardson; Edna M. O'Connor

[57] ABSTRACT

Methods for manufacturing a self-supporting substrate having a plurality of spaced-apart needles (spikes or microcapillaries) projecting upwardly from a major surface of the substrate. In a preferred method, metal is deposited onto a porous membrane such that the metal extends into the pores, after which the membrane is dissolved.

6 Claims, 4 Drawing Sheets

METHOD FOR FABRICATING A SUBSTRATE HAVING SPACED APART MICROCAPILLARIES THEREON

The United States Government has rights in this invention under Contract No. DE-AC02-83H10093 between the United States Department of Energy and the National Renewable Energy Laboratory, a Division of the Midwest Research Institute.

CROSS-REFERENCE TO RELATED APPLICATION

This application is a continuation-in-part of my copending application Ser. No. 08/009,853, filed Jan. 27, 1993, now abandoned.

BACKGROUND OF THE INVENTION

1. Field of the Invention

This invention relates generally to methods for the fabrication of surfaces punctuated by microscopic spikes or microcapillary structures. More specifically, this invention relates to techniques for forming surfaces of microscopic spikes or microcapillary structures by deposition of a material onto or through a track-etch membrane. Such structures have many applications, including cell transformation by microimpalement.

2. Description of the Prior Art

The ability to generate microscopic structures has had a major impact on many fields of science and technology, particularly in the electronics industry. Microfabrication is beginning to find applications in more diverse areas such as biotechnology as well. An example of a class of microfabricated structures is synthetic microtubules, which have been proposed to have applications in drug delivery systems, microwave components, electro-optical devices, vibration detectors, and anti-fouling paints for ships' hulls. See Pool, "101 uses for tiny tubules", Science 247:1410–1411 (1990). However, for many applications, the high cost of microfabricated structures currently prohibits their routine use. Novel fabrication methods will allow the cost of microfabricated structures to be reduced.

One application of microstructures that has been proposed recently is a novel method of introducing biomolecules into living cells, referred to as "microimpalement." This is described in my copending application, identified above. In that method, a bed of upright needles is provided onto which DNA or other biomolecules are loaded. Cells are forced onto the needles, after which an electric field is applied to cause the biomolecules to migrate into the cells' interior. The cells are then removed from the needles. The needles can comprise either simple spike structures, which can be coated with biomolecules, or they may comprise microcapillary structures, which may be filled with a solution of desired biomolecules. The width of each needle structure should be controlled such that it would be on the order of one-tenth of the diameter of the cells to be impaled, and the height should be about 2 to 5 microns. Thus, it becomes necessary to be able to manufacture inexpensive surface films or substrates with microstructures of defined dimensions.

Methods have been devised in the electronics industry for microfabrication of circuits and miniature devices. Using lithographic techniques, it is currently possible to produce devices with line widths down to 0.5 micron or less. However, in producing surfaces of microcapillaries with dimensions appropriate for microimpalement, it would be difficult to achieve the necessary aspect ratios (ratio of height to width). In addition, the cost of fabricating surfaces by techniques such as electron-beam lithography would make this method cost prohibitive. For applications such as microimpalement, where the precise dimensions and uniformity of the microstructures are not critical, methods such as those described herein for producing substrates having outwardly projecting needles are very suitable and economical.

Methods have been devised previously for the synthesis of microtubules. See Martin et al., "Template synthesis of organic microtubules", J. Am. Chem. Soc. 112:8976–8977 (1990); Martin, "Template synthesis of polymeric and metal microtubules", Adv. Mater. 3:457–459 (1991); and Brumlik and Martin, "Template synthesis of metal microtubules"J. Am. Chem. Soc. 113:3174–3175 (1991). In these papers, the authors describe what they call the "template synthesis" of organic or metal microtubules (or fibers) using filter membranes as molds. The organic tubules are created with the polymerization of pyrrole within a Nuclepore brand polycarbonate membrane by placing monomer on one side of the membrane and a polymerization reagent on the other. The synthesis of organic tubules can also be done electrochemically within the membrane. The membrane is removed by dissolution with dichloromethane to yield free monodisperse microtubules. Metal microtubules are generated by electrochemically depositing gold onto the surface of microporous alumina membranes, followed by dissolution of the alumina. Using this technology, dense arrays of upright metal microcapillaries have been generated that are attached to a gold film at their base. Appropriate chemistry was used such that "anchor" molecules were obtained in the membrane pores to promote generation of tubules rather than solid fibers.

U.S. Pat. No. 2,629,907 describes a method for coating models (made of wood, rubber, etc.) with a thin layer of nylon to improve the adhesion of sprayed-on metal in the manufacture of metal molds. The metal layer is removed by simple mechanical separation; solvent can be applied through a porous model to soften the nylon coating to aid removal of the metal mold. Such technology is intended for large-scale (macroscopic) molds for the manufacture of various items and would not be suitable for manufacture of substrates having microcapillaries or needles.

U.S. Pat. No. 3,996,991 also describes a method for manufacturing molds, in this case by an "investment casting" method. A model of the desired casting is made from a "thermally fusible" material, an investment (envelope) of a refractory material is made around the model, and then the thermally fusible model is removed by putting it in contact with a vaporized organic solvent. The inventors describe their technology as being particularly well suited to the production of very large castings, such as ship propellers.

U.S. Pat. No. 4,481,999 describes a method for forming thin unbacked metal foils (less than 2 microns in thickness). These foils are made by generating a soluble polymeric film (partially hydrolyzed polyvinyl alcohol) of a desired shape and then using vacuum vapor deposition to deposit a thin film of metal. The very thin metal films they generate have no special microscopic surface structure.

U.S. Pat. No. 4,867,223 describes a complex method of forming a metallic sheet with a concave-convex profile. Metal is deposited by chemical vapor deposition onto a drum with a surface of protrusions; a transparent mask and a light beam are used to control the deposition of the metal, and the metal film is physically peeled off from the drum. This technology requires sophisticated masking technology, and is designed around the fabrication of specific surface structures that might be used in a dry shaving device.

U.S. Pat. No. 4,898,623 describes an invention in which metal alloys are formed by making a plastic (polyacrylate) mold onto which metal is deposited by low-temperature arc vapor deposition. The metal layer is separated (presumably by simple physical means) from the plastic substrate and subjected to heat treatment to increase its density. This allows the forming of thin shapes from alloys that are difficult to shape by standard rolling and pressing methods.

U.S. Pat. No. 4,926,056 describes an alternate fabrication method for a microelectronic field ionizer. These highly specialized "volcano" structures are used to ionize a gas stream. The structures are fabricated by the same technology used to manufacture integrated circuits, and the described techniques are quite specific for the geometry and fabrication of field ionizers.

There has not heretofore been provided an expeditious method for manufacturing a self-supporting substrate having a plurality of spaced-apart microscopic needles projecting outwardly from one major surface of the substrate.

SUMMARY OF THE INVENTION

One object of the invention is to provide an improved method for the manufacture of a self-supporting substrate having a plurality of spaced, outwardly projecting needles thereon.

Another object of the invention is to provide a method for the manufacture of a self-supporting metallic substrate having a plurality of spaced, outwardly projecting microcapillaries thereon.

Another object of the invention is to provide a technique for manufacturing a self-supporting substrate having a plurality of outwardly projecting spikes or microcapillaries thereon having a diameter in the range of about 0.1 to 5 microns.

Additional objects, advantages, and novel features of the invention shall be set forth in part in the description that follows and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the method of the invention may comprise, in one embodiment:

(a) providing a porous membrane having a plurality of pores extending therethrough;

(b) depositing a metal or other refractory material onto a major surface of the membrane in a manner such that a layer of the metal (or refractory material) is formed on the major surface of the membrane, and wherein the metal or other material extends into the pores to form a plurality of spaced-apart needles (i.e., spikes or microcapillaries); and (c) dissolving said membrane to leave a self-supporting substrate with the needles projecting outwardly from one surface of the substrate.

In another embodiment the invention provides a method comprising:

(a) providing a porous membrane having a plurality of pores extending therethrough;

(b) positioning the porous membrane parallel and adjacent to an electrically conductive substrate;

(c) electroplating a metal onto the conductive substrate through the pores of the membrane; and (d) dissolving the membrane to leave the conductive substrate with metallic needles projecting outwardly from one surface of the substrate.

The methods of the invention provide for efficient and expeditious manufacture of self-supporting substrates having a plurality of spaced-apart microstructures (e.g., needles or microcapillaries) on a major surface of the substrate.

Other advantages of the techniques and methods of this invention will be apparent from the following detailed description and the accompanying drawings.

DETAILED DESCRIPTION OF THE PREFERRED EMBODIMENTS

The present invention provides a simple and effective means of producing planar surfaces of a given material that are punctuated by very small projections. These projections can be produced in the form of solid spikes or hollow microcapillary structures, which can generally be referred to as microstructures or needles. The method is referred to as "molded deposition."

In accordance with the invention, the surface punctuated by microstructures is made by depositing a material onto or through a track-etch membrane. These membranes have a smooth upper surface that is penetrated by precisely defined pores. The preferred membranes are plastic (e.g., polycarbonate) and are commercially available from Nucleopore Corporation in a variety of pore sizes ranging from 0.015 to 14 microns. For use herein, pore sizes in the range of 0.1 to 5 microns are preferred. The thickness of the membranes is between about 5 and 10 microns, and the pores penetrate the membrane at a variety of angles (up to $+/-34$ degrees from perpendicular to the surface of the membrane).

Figure 1A:
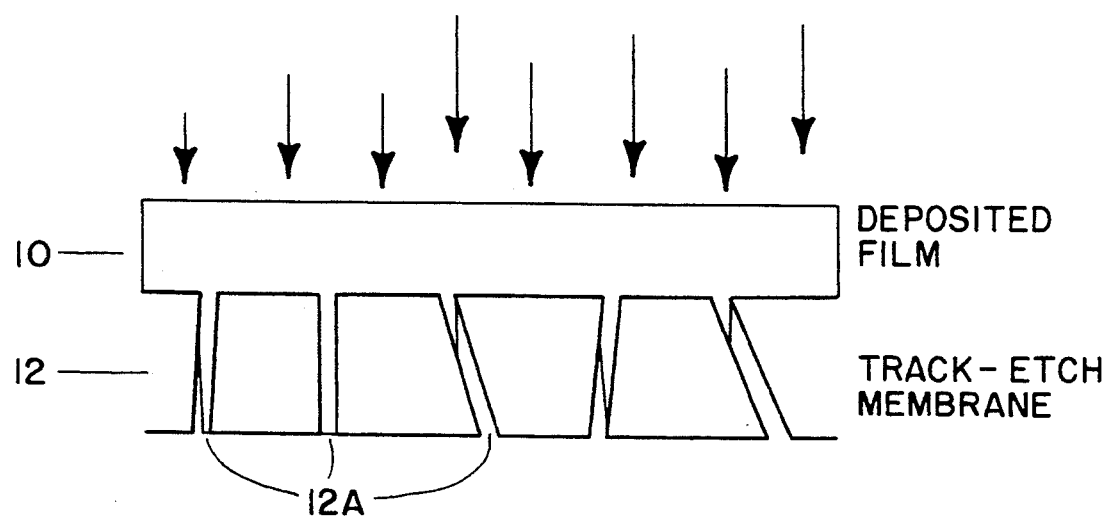
FIG. 1 illustrates one manner in which a major surface of a deposited film can be generated having a plurality of spikes thereon.
Figure 1B:
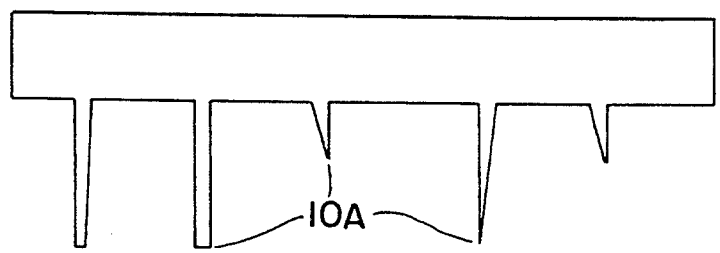

A preferred embodiment of this invention is illustrated in FIGS. 1A and 1B. A film 10 of a refractory material is deposited onto a track-etch polycarbonate membrane 12 using a method such as those employed in the semiconductor industry. These methods might include evaporation, sputtering, chemical vapor deposition, or other conventional technique. Some of the deposited material extends into and partially fills the pores 12A of the membrane. The depth of filling depends on the angle of the pore relative to the direction of deposition. Material accumulates until the pores become plugged. Further deposition gives thickness to the deposition film to provide mechanical strength. Following deposition, the membrane is dissolved with an appropriate solvent to remove the track-etch membrane. For example, Nucleopore brand polycarbonate membranes can be dissolved with a solvent such as chloroform. Dissolution of the membrane leaves behind a surface of spikes 10A; the maximum diameter of the spikes is determined by the pore size of the membrane. Thus, by using a track-etch membrane as a mold, a smooth surface having a plurality of outwardly projecting spikes call be created.

The deposition can be of almost any material that can be deposited by such means, and is chosen based upon the intended use of the surfaces. For example, for microimpalement, a hard, biologically inert material is desirable. Whatever material is used must be resistant to the solvent (e.g., chloroform) that is used to dissolve the polycarbonate membrane. It must also be of sufficient strength and integrity to remain intact as a self-supporting film once the polycarbonate membrane is dissolved. The deposition must be done at a temperature below the melting point of the membrane; for this reason, it is preferred to mount the membranes on a cooled stage for the deposition or use a technique such as chemical vapor deposition that can be done at relatively low temperature.

Suitable materials for deposition in this invention include metals such as aluminum,, nickel, tungsten, copper, gold, silver, ferrous metals, titanium, zinc, chromium, tin, or metallic alloys. Other refractory materials could also be used such as carbon (e.g., diamond-like carbon), silica, polytetrafluoroethylene, or other hard materials.

Figure 2A:
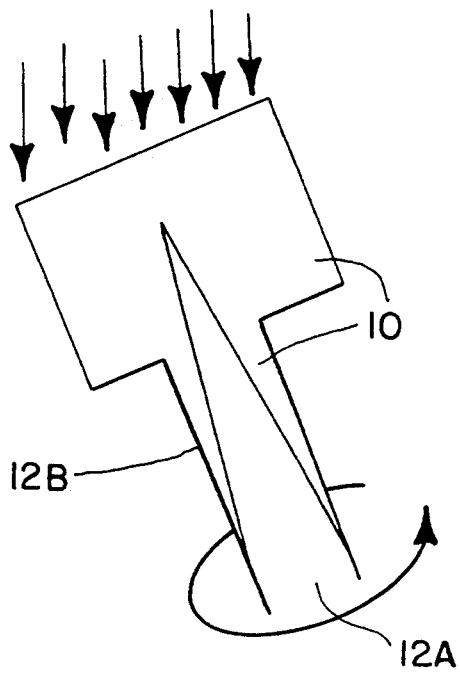
FIG. 2 illustrates two manners in which the method of FIG. 1 can be modified to generate a surface of microcapillaries instead of spikes.
Figure 2B:
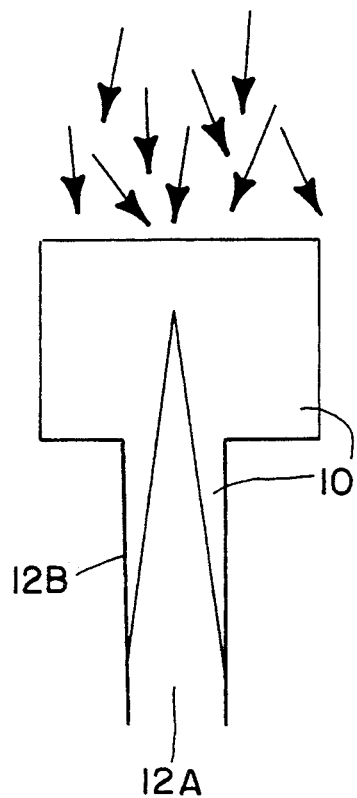
Figure 2C:
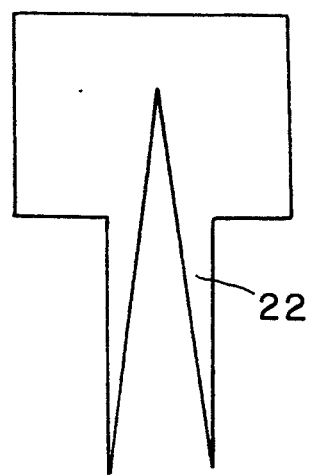

FIGS. 1A and 1B depict unidirectional deposition of material, as from a point source. Alternative structures can be generated by changing the geometry of deposition. Such variations are shown in FIGS. 2A and 2B. For example, the membrane could be held at an angle relative to the incoming stream of material and rotated during the deposition process, as illustrated in FIG. 2A. In this case, the deposited material 10 accumulates completely around the walls 12B of the pore 12A until the point at which the pore becomes plugged. Alternatively, the material could be deposited from a diffuse source, as demonstrated in FIG. 2B. Once again, the material 10 will accumulate completely around the walls 12B of the pore 12A. The result of either of these deposition modes, following dissolution of the membrane, is shown in FIG. 2C. Instead of generating simple spikes, microcapillary-like structures 22 are formed. The resulting structures have diameters corresponding to the original pore diameter, but have hollow centers. The height of the structures is determined by the angles of deposition (i.e., either the angle of the membrane during rotation or the angles at which particles of material from the diffuse source impact the surface). FIGS. 2A, 2B and 2C depict the case where the pore is normal to the surface of the membrane; for angled pores, the resulting structures would be somewhat skewed relative to the plane of the membrane in a manner related to the mode of deposition.

These microcapillary structures could be highly desirable for certain applications, such as the delivery of biomolecules into cells as in microimpalement. The hollow centers could be filled with a solution of the molecules to be delivered. Note also that sequential deposition steps could be used to generate structures with special properties. For example, deposition of a dielectric followed by deposition of a conductor would result in microcapillaries with insulating outside surfaces and conductive cores.

Figure 3A:
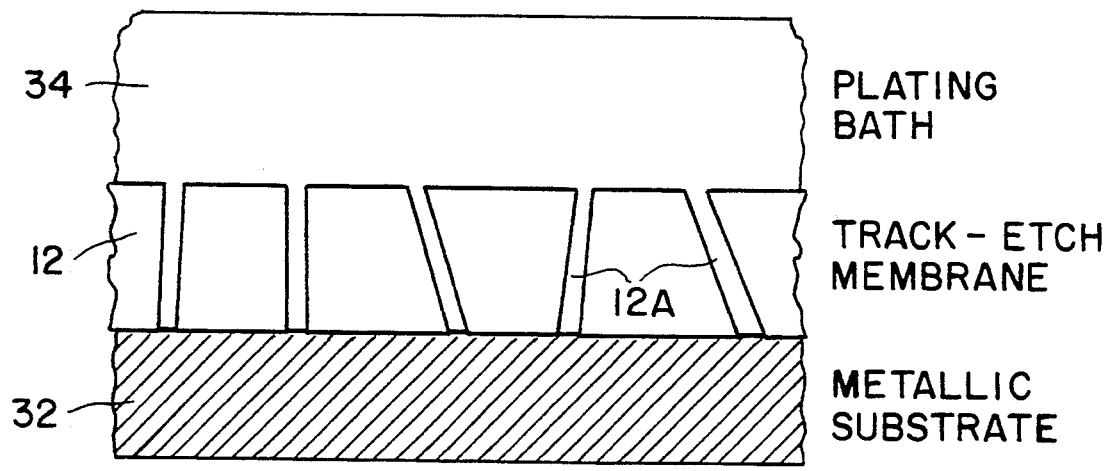
FIG. 3 illustrates a method for creating a plurality of spikes on an electrically conductive substrate by electroplating a material through a porous membrane onto the underlying substrate.
Figure 3B:
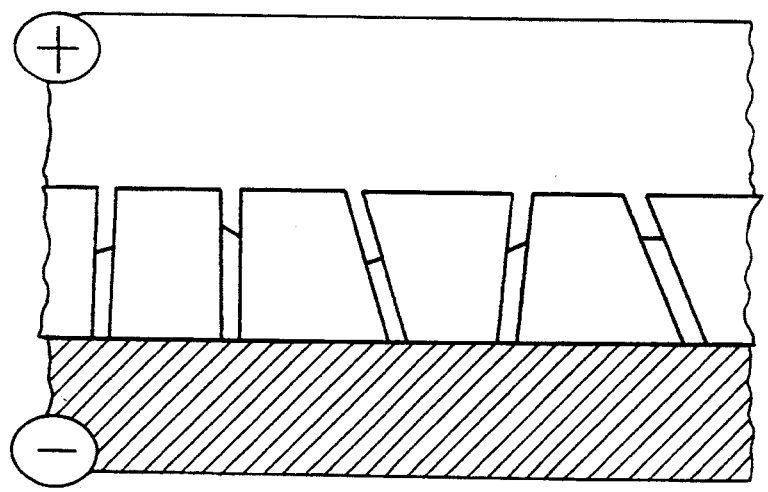
Figure 3C:
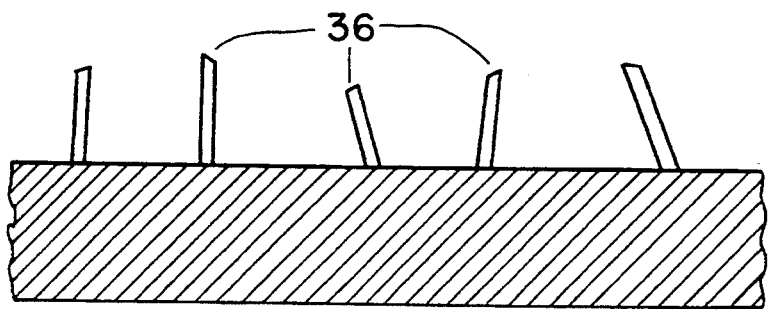

Another related technique for forming a surface having a plurality of microstructures projecting outwardly from one major surface is illustrated in FIGS. 3A, 3B and 3C. In this case, material is deposited through the membrane rather than onto it. Material is deposited by a process of electroplating or other conventional technique. The pores 12A of a polycarbonate track-etch membrane 12 (having a plurality of pores therethrough) are filled with a plating solution and then the membrane is laid onto a metal substrate 32. A reservoir of plating solution 34 is provided above the membrane, and an electric field is applied between the metal substrate and the plating bath. Material from the solution is plated through the pores onto the surface of the substrate 32. The membrane is then dissolved away to leave a plurality of spikes 36 supported on the surface of the substrate 32. By creating conditions in which the metal is preferentially deposited on the walls of the pores, as by chemical modification of the pore walls, microcapillary structures may be formed.

Figure 4:
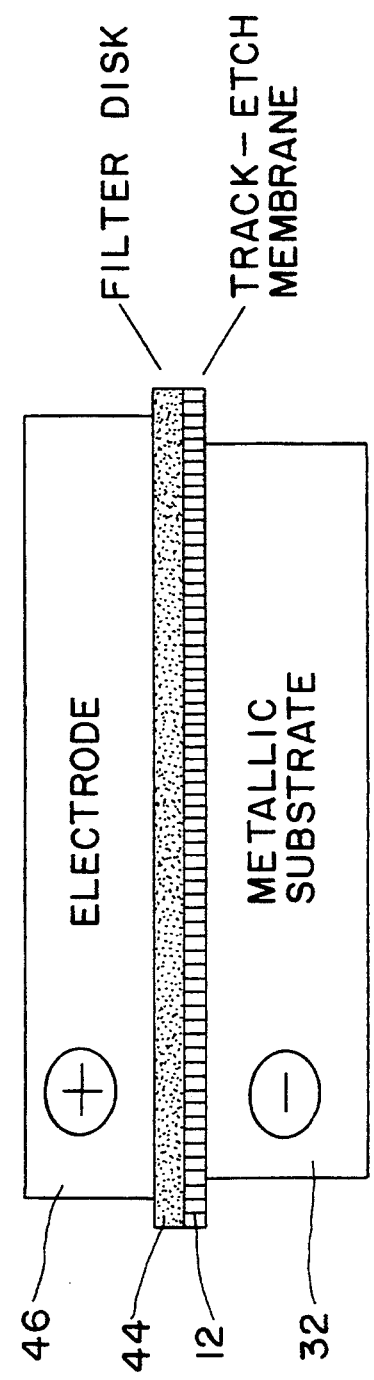
FIG. 4 illustrates one possible configuration for electroplating metal through a track-etch membrane onto a major surface of an electrically conductive substrate.

One method of carrying out this electrochemical deposition through tile membranes is illustrated in FIG. 4. A metallic substrate 32 is provided with a smooth, planar upper surface. A drop of plating solution is applied to the upper surface of the substrate 32, and a Nucleopore brand track-etch polycarbonate membrane 12 is laid on top. The solution fills the membrane pores by capillary action. A filter disk 44 is then provided to serve as a reservoir for plating solution; one example of a suitable filter that is commercially available is a polysulfone HT TUFFRYN brand from Gelman Sciences. Other commercially available filters may also be used. The filter disk is soaked in plating solution, and then it is laid on top of the polycarbonate membrane. Bubbles between the surfaces must be avoided. Finally, an electrode 46 of a suitable metal is applied to the top of the filter disk. An electric field is applied between the metallic substrate and the top electrode such that plating will occur at the surface of the substrate 32. Following sufficient time to complete the plating process, the electrode and filter disk are then physically removed; the polycarbonate membrane is removed chemically by washing with chloroform or other suitable solvent. This will expose the microstructures on the surface of the substrate 32.

The methods described above have several advantages over conventional methods for microstructure formation. The procedures are simple, inexpensive, and amenable to scale-up. A wide variety of materials can be used in the deposition process. In addition, the dimensions of the microstructures can be relatively precisely controlled by simply selecting the desired membrane pore size and setting up the appropriate deposition geometry. The microstructures can be made to resemble microcapillaries or simple spikes depending upon the method chosen. The electroplating technique also has the advantage that the resulting spikes or microcapillaries are attached to a thick, solid substrate rather than a thin, fragile film. This results in easier handling and avoids problems of curling of the surfaces.

EXAMPLE 1

A film of 3–4 microns of aluminum was deposited onto several Nucleopore brand polycarbonate track-etch membranes which have a pore diameter of 0.8 microns. A conventional evaporation setup was used, in which the aluminum material source was sufficiently small and at a great enough distance from the target membrane to behave essentially as a point source. This produced highly directional deposition of aluminum (as described above for FIGS. 1A, 1B, and 1C). The resulting aluminum/polycarbonate films were bathed briefly in chloroform to dissolve the polycarbonate membrane, leaving a self-supporting aluminum substrate with a plurality of spaced projections. The aluminum surfaces were examined by scanning electron microscopy (SEM). The surfaces were shown to be punctuated by spikes of the desired dimensions. The spike diameters at their bases were approximately 0.8 microns at the maximum, and they were flattened as predicted for formation by deposition onto one side of the pore (see FIGS. 1A and 1B). The spikes varied in height with a maximum of about 3 microns and were tapered to a point at their upper end.

EXAMPLE 2

Films of "diamond-like" carbon (DLC) were deposited onto Nucleopore brand polycarbonate track-etch membranes with 0.8 and 3 micron pore sizes. Plasma-enhanced chemical vapor deposition was used to deposit films approximately 3 microns thick. The material effectively was deposited from a diffuse source, as diagrammed in FIG. B. The products were bathed briefly in chloroform to dissolve the polycarbonate membrane; the resulting DLC films were self-supporting. Following application of a 200 Angstrom thick layer of gold, the surfaces were visualized by SEM. The samples were shown to consist of a smooth surface covered with an array of upright microcapillary structures. The DLC material was deposited on the walls of tile pores until the point at which the base of each pore became restricted by material buildup. The walls of the microcapillaries were very thin, providing a relatively large-volume, hollow core. Using 3 micron pore size membranes, microcapillaries were generated with about a 3 micron diameter and a length (i.e., height) equal to the membrane thickness (about 10 microns). With the 0.8 micron pore size membranes, the microcapillary diameters were approximately 0.8 microns, but the length (i.e., height) of the structures was only 2 microns or less. This was apparently due to breakage of tile microcapillary structures off of the supporting DLC film; free full-length microcapillaries were observed that had detached from the surface. The free microcapillaries could also be useful for many applications where microcapillaries are required.

EXAMPLE 3

The electroplating method illustrated in FIGS. 3A, 3B and 3C has also been tested. Using a setup analogous to that shown in FIG. 4, a standard nickel plating bath was used to deposit metal through Nucleopore brand polycarbonate track-etch membranes onto underlying brass substrates. Membrane pore sizes of 0.4, 0.6, 0.8, 1.0, 2.0 and 3.0 microns were used successfully. Typically, a dense field of spikes with outer diameters close to the membrane pore size was observed to cover a fairly large portion of the plated surface. The spike heights were typically 1–4 microns. Spike height could be controlled roughly by adjusting bath volume and plating time. The nickel spikes appeared to be relatively sturdy, and in some cases were noted to be hollow or at least have an indentation at the tip, presumably due to preferential deposition at the perimeter of the pore. Generating surfaces of microstructures by this method requires only inexpensive materials and equipment and can be completed in as little as about ten minutes.

The foregoing is considered as illustrative only of the principles of the invention. Further, because numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follow.

The embodiments of tile invention in which an exclusive property or privilege is claimed are defined as follows:

1. A method for manufacturing a self-supporting substrate having a plurality of spaced needles projecting outwardly from a major surface of said substrate, the method comprising the steps of:
    (a) providing a porous polycarbonate membrane having a plurality of pores extending therethrough wherein said pores have a diameter of about 0.1 to 5 microns; and wherein said membrane has a thickness of about 5 to 10 microns;
    (b) depositing a metal onto a major surface of said membrane in a manner such that a layer of the metal is formed on said major surface of said membrane, and wherein the metal extends into the pores to form said plurality of spaced needles wherein said membrane is disposed at an angle relative to the metal being deposited, and rotated such that said formed needles comprise nucricaoukkarues; and
    (c) dissolving said membrane in solvent to leave a self-supporting metal substrate with said needles projecting outwardly therefrom.

2. A method in accordance with claim 1, wherein said metal is selected from the group consisting of aluminum, gold, tungsten, nickel, and silver.

3. A method in accordance with claim 1, wherein said metal is deposited on said membrane by means of chemical vapor deposition.

4. A method in accordance with claim 1, wherein said metal is deposited on said membrane by means of evaporation from a metal source.

5. A method in accordance with claim 1, wherein said metal is deposited on said membrane by means of sputtering.

6. A method for manufacturing a self-supporting substrate having a plurality of spaced needles projecting outwardly from a major surface of said substrate, the method comprising the steps of:
    (a) providing a porous polycarbonate membrane having a plurality of pores extending therethrough wherein said pores have a diameter of about 0.1 to 5 microns; and wherein said membrane has a thickness of about 5 to 10 microns;
    (b) depositing a metal onto a major surface of said membrane in a manner such that a layer of the metal is formed on said major surface of said membrane, and wherein the metal extends into the pores to form said plurality of spaced needles, wherein said metal is deposited onto said surface of said membrane from a diffuse source such that said formed needles comprise microcapillaries; and
    (c) dissolving said membrane in solvent to leave a self-supporting metal substrate with said needles projecting outwardly therefrom.

* * * * *